United States Patent
Yu et al.

(10) Patent No.: US 8,030,776 B2
(45) Date of Patent: Oct. 4, 2011

(54) INTEGRATED CIRCUIT WITH PROTECTIVE STRUCTURE

(75) Inventors: Chen-Hua Yu, Hsin-Chu (TW); Shin-Puu Jeng, Hsin-Chu (TW); Shang-Yun Hou, Hsin-Chu (TW); Hao-Yi Tsai, Hsin-Chu (TW); Hsien Wei Chen, Sinying (TW); Hsiu-Ping Wei, Dajia Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 206 days.

(21) Appl. No.: 12/575,078

(22) Filed: Oct. 7, 2009

(65) Prior Publication Data

US 2011/0079922 A1    Apr. 7, 2011

(51) Int. Cl.
- *H01L 23/48* (2006.01)
- *H01L 23/52* (2006.01)
- *H01L 29/40* (2006.01)
- *H01L 23/053* (2006.01)
- *H01L 23/12* (2006.01)
- *H01L 27/10* (2006.01)
- *H01L 29/74* (2006.01)

(52) U.S. Cl. . 257/758; 257/211; 257/700; 257/E21.016; 257/E21.575

(58) Field of Classification Search .................. 257/211, 257/700, 758, E21.016, E21.575
See application file for complete search history.

(56) References Cited

U.S. PATENT DOCUMENTS

| | | | | |
|---|---|---|---|---|
| 6,016,000 A * | 1/2000 | Moslehi | ......... | 257/522 |
| 6,455,943 B1 * | 9/2002 | Sheu et al. | ......... | 257/786 |
| 6,956,289 B2 * | 10/2005 | Kunikiyo | ......... | 257/758 |
| 7,112,883 B2 * | 9/2006 | Hasunuma | ......... | 257/714 |
| 7,626,276 B2 * | 12/2009 | Hess et al. | ......... | 257/779 |
| 7,781,871 B2 * | 8/2010 | Cabral et al. | ......... | 257/660 |
| 2003/0136979 A1 * | 7/2003 | Cho et al. | ......... | 257/212 |
| 2005/0045882 A1 * | 3/2005 | Park et al. | ......... | 257/59 |
| 2005/0269702 A1 * | 12/2005 | Otsuka | ......... | 257/750 |
| 2006/0011813 A1 * | 1/2006 | Park et al. | ......... | 250/208.1 |
| 2006/0145347 A1 * | 7/2006 | Aida | ......... | 257/758 |
| 2008/0173973 A1 * | 7/2008 | Koubuchi et al. | ......... | 257/506 |

\* cited by examiner

*Primary Examiner* — Ida M Soward
(74) *Attorney, Agent, or Firm* — Duane Morris LLP; Steven E. Koffs

(57) ABSTRACT

A structure includes a semiconductor substrate having semiconductor devices formed on or in the substrate. An interconnecting metallization structure is formed over and connected to the devices. The interconnecting metallization structure including at least one dielectric layer. A passivation layer is deposited over the interconnecting metallization structure and the dielectric layer. At least one metal contact pad and at least one dummy metal structure are provided in the passivation layer. The contact pad is conductively coupled to at least one of the devices. The dummy metal structure is spaced apart from the contact pad and unconnected to the contact pad and the devices.

14 Claims, 5 Drawing Sheets

INTEGRATED CIRCUIT WITH PROTECTIVE STRUCTURE

FIELD OF THE INVENTION

The present disclosure relates to fabrication of integrated circuits.

BACKGROUND

In semiconductor fabrication, thermal stress is a major consideration in designing the interface between a semiconductor integrated circuit (IC) chip and the package substrate to which it is mounted. The package substrate has a high coefficient of thermal expansion (CTE) compared to the silicon of the IC chip. For example, the package substrate may have a CTE of about 15 ppm/deg. C., while the IC chip has a CTE of about 3 ppm/deg. C. In a flip-chip packaging process, after the IC has been mounted to the package substrate, a large change in temperature would result in differential expansion or contraction between the substrate and the IC. This differential expansion will induce warpage, causing warpage-induced damage. In the presence of warpage, it is likely that the solder bumps (connecting the contact pads of the IC to the contacts of the package substrate) will crack.

Various techniques have been developed to prevent damage due to CTE mismatch between the IC substrate material and the package substrate material. For example, it is common to insert an underfill material into the space between the IC and the package substrate, to fill the gaps around the solder balls. The underfill may have a CTE that is intermediate between the CTE of the IC and the CTE of the package substrate.

The continued decrease in IC dimensions has led to the use of low dielectric constant (low-k) materials (e.g., SiOC, SiOCN or SiCOH) to form the inter-metal dielectric (IMD) interconnect layers. For smaller technology nodes, foundries have considered the use of extreme low k (ELK) dielectric materials having a dielectric constant k of 2.6 or less. A common method for providing an ELK dielectric is to form a porous layer of dielectric, because the air in the pores has a dielectric constant of 1.0, reducing the overall average value of k for the ELK layer. Unfortunately, the introduction of pores renders the ELK dielectric layer more brittle, and more susceptible to damage from warpage due to CTE mismatch.

Improved methods of protecting the IMD layers is desired.

SUMMARY OF THE INVENTION

In some embodiments, a structure comprises a semiconductor substrate having semiconductor devices formed thereon. An interconnecting metallization structure is formed over and connected to the devices. The interconnecting metallization structure including at least one dielectric layer. A passivation layer is provided over the interconnecting metallization structure and the dielectric layer. At least one metal contact pad and at least one dummy metal structure are provided in the passivation layer. The contact pad is conductively coupled to at least one of the devices. The dummy metal structure is spaced apart from the contact pad and unconnected to the contact pad and the devices.

In some embodiments, a method comprises providing a semiconductor substrate having semiconductor devices thereon or therein. An interconnecting metallization structure is formed over and connected to the devices. The interconnecting metallization structure includes at least one dielectric layer. A passivation layer is provided over the interconnecting metallization structure and the dielectric layer, with at least one metal contact pad and at least one dummy metal structure in the passivation layer. The contact pad is conductively coupled to at least one of the devices. The dummy metal structure is spaced apart from the contact pad and unconnected to the contact pad and the devices.

DETAILED DESCRIPTION

Figure 1A:
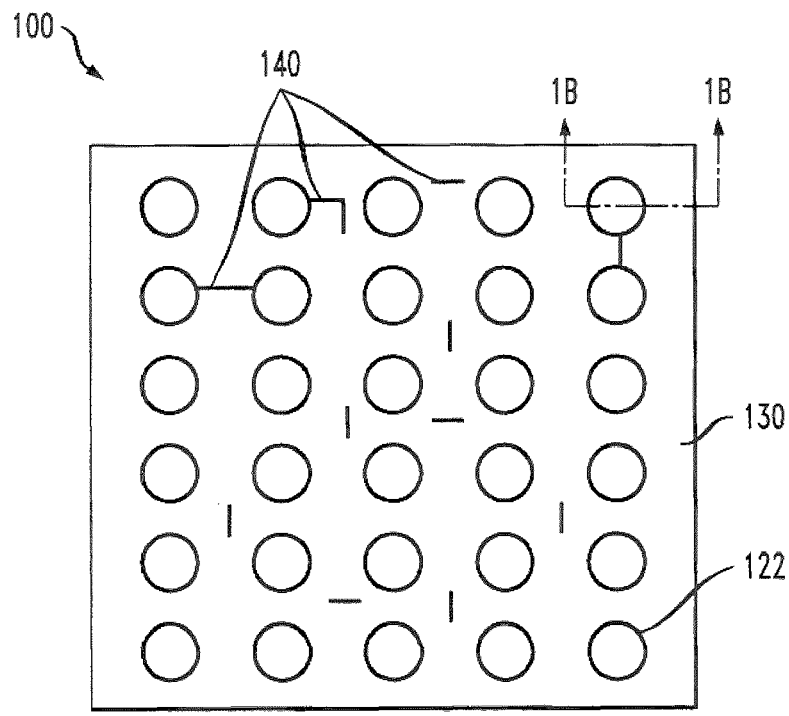
FIG. 1A is a plan view of a conventional IC.

This description of the exemplary embodiments is intended to be read in connection with the accompanying drawings, which are to be considered part of the entire written description. The drawings are not drawn to scale. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Figure 1B:
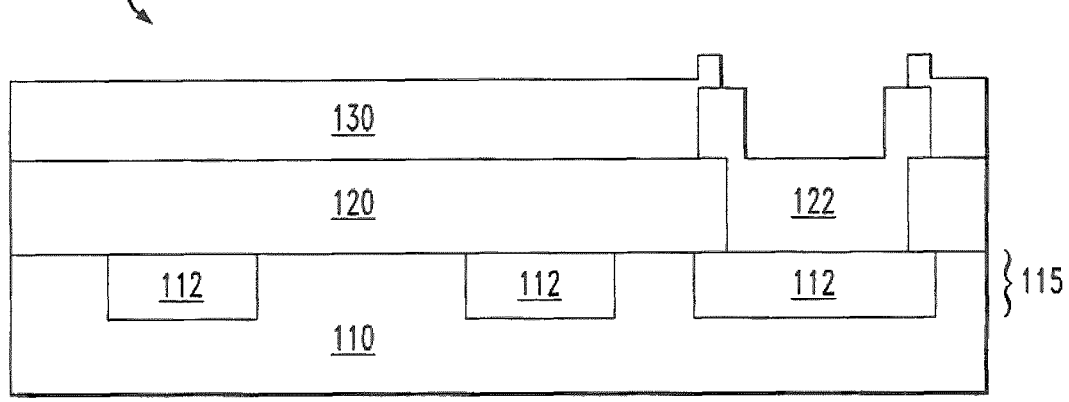
FIG. 1B is a cross sectional view of the IC of FIG. 1A, taken along section line 1B-1B.

Reference is first made to a conventional IC 100 shown in FIGS. 1A and 1B. A semiconductor substrate 110 has a plurality of semiconductor devices (not shown) formed thereon or therein, by way of a connection to one of the patterns 112 of the interconnect structure. An interconnecting metallization structure 115 is formed over and connected to the devices. The interconnecting metallization structure 115 includes at least one IMD layer 110 and a plurality of conductive patterns 112 formed in the IMD layer 110. A passivation layer 120, 130 is deposited over the interconnecting metallization structure 115. A metal contact pad 122 is formed in the passivation layer 120. The contact pad 122 is conductively coupled to at least one of the devices (not shown). A plurality of conductive lines 140 are provided, forming the redistribution layer.

The present inventors have discovered that the addition of metal (e.g., aluminum, Cu or W) in the second passivation sub-layer can shield the packaged IC from thermal stresses and prevent cracking of the IMD material, even for the more brittle ELK dielectric materials.

Figure 2A:
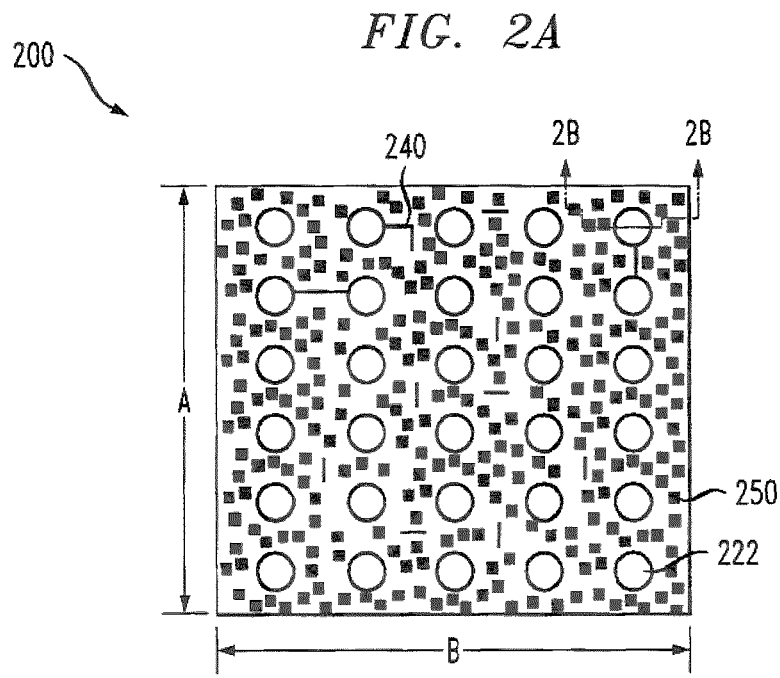
FIG. 2A is a plan view of an IC according to one embodiment.
Figure 2B:
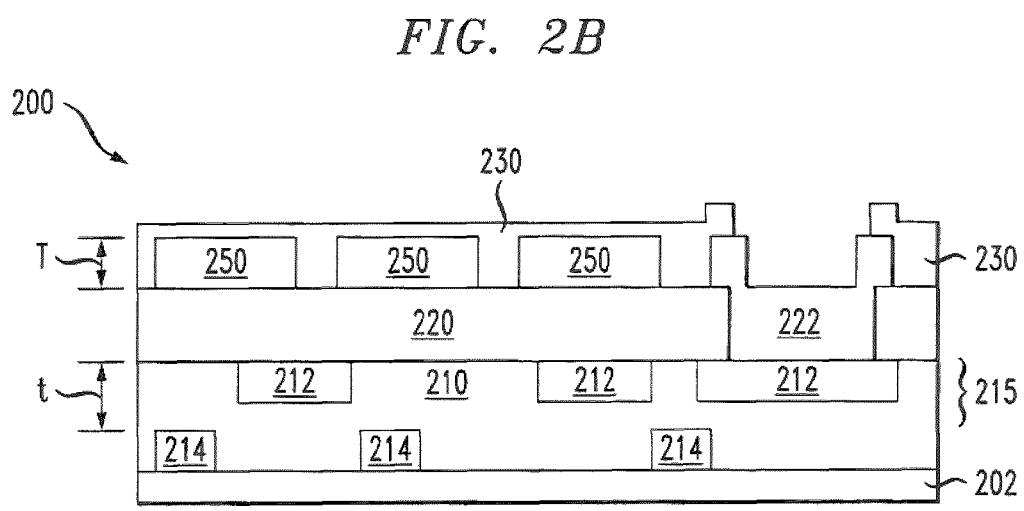
FIG. 2B is a cross sectional view of the IC of FIG. 2A, taken along section line 2B-2B.

FIGS. 2A and 2B show an IC 200 according to a first embodiment. A semiconductor substrate 202 has semiconductor devices 214 formed thereon or therein. In FIG. 2B, the gate structures of transistors 214 are shown above a silicon substrate 202, but other substrate materials may be used, such as silicon on glass, silicon on sapphire, gallium arsenide, or the like, and other devices, such as capacitors and diodes may be included.

An interconnecting metallization structure 215 is formed over and connected to the devices 214. The interconnecting metallization structure 215 includes interconnect lines 212 and at least one IMD dielectric layer 210. The dielectric layer 210 can be, for example, an oxide layer, nitride layer, oxynitride layer or other dielectric layer. The dielectric layer 210 may be a low-k or ELK material such as SiOC, SiOCN or SiCOH, having a dielectric constant $k \leq 2.6$. The dielectric layer 210 can be formed by, for example, a chemical vapor deposition (CVD) method, physical vapor deposition (PVD) method, spin-on method or other method that is adapted to form a dielectric material 210 over the substrate 202.

A passivation layer 220, 230 is deposited over the interconnecting metallization structure 212 and the dielectric layer 210. In the example of FIGS. 2A and 2B, the passivation layer comprises a first sub-layer 220 over the interconnecting metallization structure 215, and a second sub-layer 230 over the first sub-layer 220. The first passivation sub-layer 220 may be SiO, SiO2, SiN, and/or SiON, for example. The second passivation sub-layer 230 may be formed of SiO, SiO2, SiN, SiON, and/or polyimide, for example.

At least one metal contact pad 222 and at least one dummy metal structure 250 are provided in the passivation layer 220, 230. The contact pad 222 is formed at least partially in the first sub-layer 220 and the dummy metal structure 250 is formed in the second sub-layer 230. The contact pad 222 is conductively coupled to at least one of the devices 214 by way of the interconnects 212. Although the figures schematically represent the contact pads 222 as circles, one of ordinary skill will understand that other polygonal shapes may be used for contact pads, such as rectangles or rectangles with beveled corners.

The dummy metal structure 250 is spaced apart from the contact pad 222 and unconnected to the contact pad 222 and the devices 214. The dummy metal structure 250 is located in the second sub-layer 230. In some embodiments, the dummy metal structures 250 are squares, measuring about 3 μm by 3 μm. Dummy metal structures of other sizes and shapes may be used. The number and size of the dummy metal structures is selected to meet a desired metal density (explained below), while complying with normal design rules for spacing between metal patterns in the interconnect structures 215. For example, a clearance of at least 5 μm may be maintained between the contact pad 222 and any of the dummy metal structures 250.

The IC of FIGS. 2A and 2B may be made by the following process. Front End of Line processing is performed to form the circuitry 214. The Back End of Line Processes then form the interconnect structure 215 above the active device layers using a copper damascene process, for example. Although FIG. 2B only shows the copper circuit paths 212 of the top metal layer $M_T$, the interconnect structure 215 typically includes from three to nine IMD layers with associated circuitry. Following deposition of the top metal layer 212 of the interconnect structure 215, the first passivation sub-layer 220 is deposited, for example by CVD, PVD, a spin-on method, or other technique. The first passivation sub-layer 220 is patterned (e.g., by a photolithographic process) to form an opening for the contact pad 222. A conformal conductive layer, such as aluminum (Al) is deposited (for example, by CVD, PVD, or the like), and patterned to form the discrete contact pad 222 and dummy metal structures 250. The second passivation sub-layer 230 is formed above the first sub-layer 220, and is etched to expose the contact pad 222 using a dry etch or plasma etch process, for example.

FIG. 2A shows the structures in the passivation layer 220, 230. As shown in FIG. 2A, the semiconductor substrate 202 has a substrate area A×B. The contact pad 222 has a contact pad area. The dummy metal structures have a total dummy metal area and the passivation layer has one or more optional conductive lines 240 with a conductive line area. The conductive lines 240 provide additional routing paths to connect lines 212 in the interconnect structure 215.

In some embodiments, the passivation layer 220, 230 has a metal density of at least 20%, where the metal density is a ratio of (contact pad area 222+dummy metal area 250+conductive line area 240 in the passivation layer 220, 230)/substrate area. In some embodiments, the metal density is at least 30%. The inventors have also found that damage due to thermal stresses is improved if the metal density is at most 80%. In some embodiments, the metal density is at least 30% and at most 80%. By comparison, the metal density of the conventional IC 100 shown in FIGS. 1A and 1B is typically between 7% and 12%.

The inventors have also found that the amount of protection provided to the dielectric layer can be influenced by a ratio of metal thickness in the passivation layer to IMD thickness. In some embodiments, the dummy metal structure 250 has a thickness T, the IMD dielectric layers 210 have a total thickness t, and a ratio of T/t is at least 0.5. Preferably, the value of T/t is at least 0.5. Generally, a larger value of T/t is better for stress release. In one embodiment, the Aluminum thickness T is in the range of 1.4 μm to 8.0 μm, and the thickness t is in the range from 0.45 μm to 1.8 μm.

Figure 3:
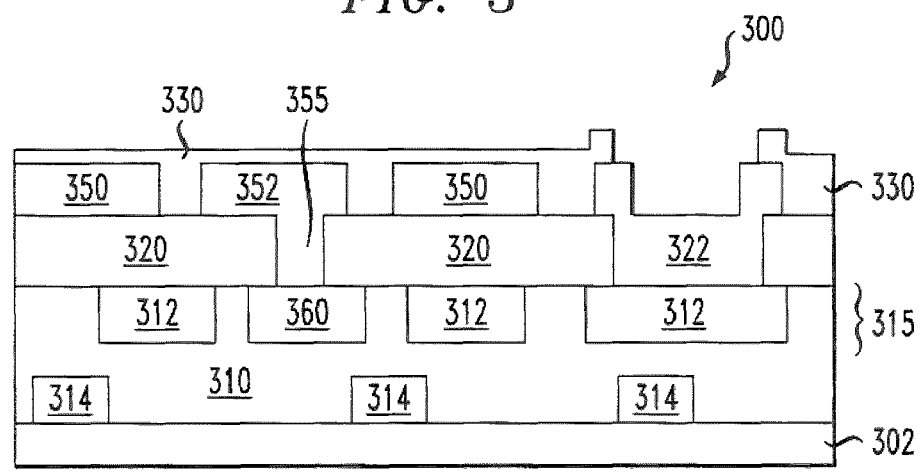
FIG. 3 is a cross-sectional view of an IC according to a second embodiment.

FIG. 3 is a cross sectional view of an IC 300, which is a variation of the IC shown in FIGS. 2A and 2B. In FIG. 3, like items have the same reference numerals as in FIGS. 2A and 2B increased by 100. The substrate 302, devices 314, interconnect 315, IMD 310, top metal layer 312, passivation layer 320, 330, contact pad 322, and dummy metal structures 350 are the same as respective substrate 202, devices 214, interconnect 215, IMD 210, top metal layer 212, passivation layer 220, 230, contact pad 222, and dummy metal structures 250, and descriptions of these structures are not repeated.

In IC 300, at least one of the dummy metal structures 352 is connected by way of a dummy via 355 to a dummy pattern 360 in a top metal layer of the interconnecting metallization structure 315. (Unlike top metal patterns 312, the dummy pattern 360 is not connected directly or indirectly to any of the devices 314). The dummy pattern 360 and dummy via 355 provide additional reinforcement for the IMD layers 310, and further protect the IMD layers from cracking or damage during thermal cycles. The metal-metal connection strength provided by the dummy via is greater than dielectric to dielectric connection strength.

Using a similar fabrication process to that described above with reference to IC 200, the dummy metal structure 360 in the top metal layer is formed by a damascene process. An opening is formed in first passivation sub-layer 320 above the dummy metal pattern 360 located in the top metal layer. This opening is formed by the same etching process that forms the opening for contact pad 322. Then, each of the dummy via 355 and the dummy metal structure 352 are formed by depositing aluminum over the first passivation sub-layer 320, so that the aluminum fills the hole (above dummy metal structure 360) formed in the first passivation sub-layer 320 to form dummy via 355 at the same time contact pad 322 is formed. The aluminum layer is then etched to form the dummy metal structures 350, 352 and contact pad 322, and the second passivation sub-layer 330 is then deposited over dummy metal structures 350, 352 and etched in the manner described above.

Figure 4:
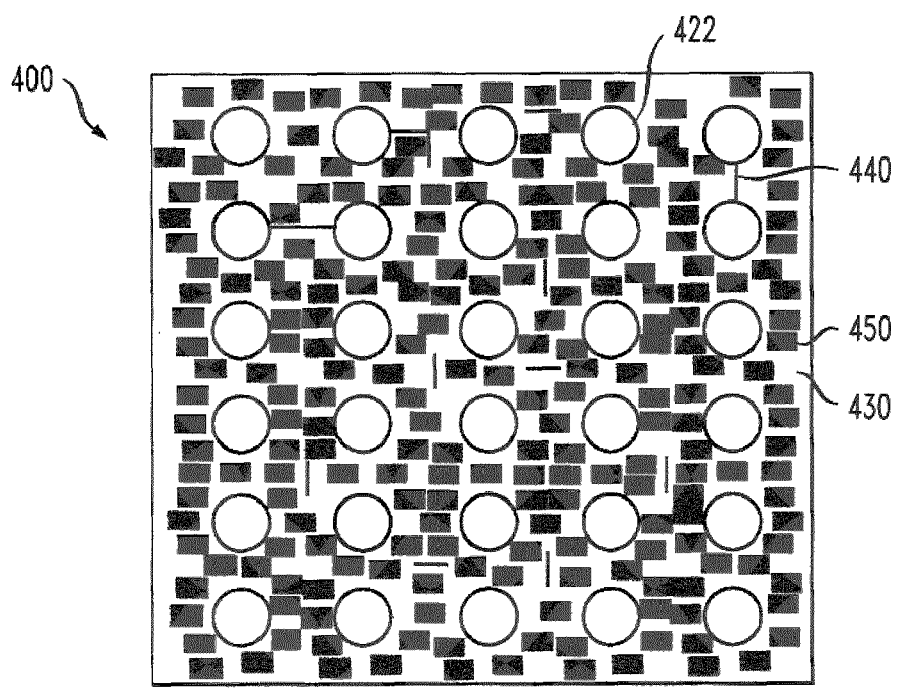
FIG. 4 is a plan view of an IC according to a third embodiment.

FIG. 4 is a plan view of a third exemplary IC 400, which is a variation of the IC shown in FIG. 2A. In FIG. 4, like items have the same reference numerals as in FIG. 2A, increased by 200. The second passivation sub-layer 430, contact pad 322, and connecting lines 440 are the same as respective passivation sub-layer 230, contact pad 222, and connecting lines 240, respectively, and descriptions of these structures are not repeated. IC 400 differs from IC 200 in that dummy metal structures 450 are not squares, but are rectangles. The dummy metal structures may be sized at 6 μm by 3 μm, for example. The dummy metal structures 450 are not limited to squares or rectangles, and may alternatively be other polygonal shapes, circles, or ellipses, for example.

Figure 5A:
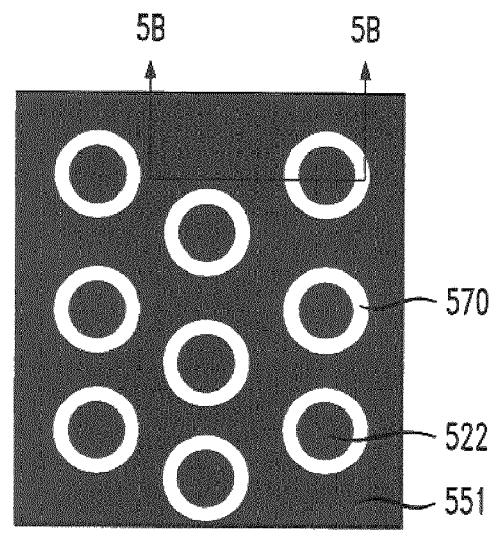
FIG. 5A is a plan view of an IC according to a fourth embodiment.
Figure 5B:
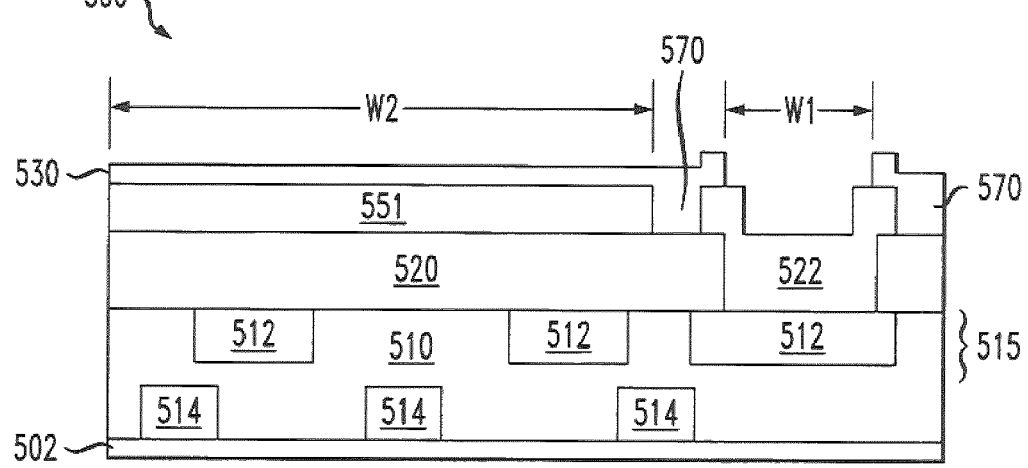
FIG. 5B is a cross sectional view of the IC of FIG. 5A, taken along section line 5B-5B.

In some embodiments, the dummy metal structure may be wider than the contact pad. FIGS. 5A and 5B show an IC 500, which is a variation of the IC shown in FIGS. 2A and 2B. In FIGS. 5A and 5B, like items have the same reference numerals as in FIGS. 2A and 2B increased by 300. The substrate 502, devices 514, interconnect 515, IMD 510, top metal layer 512, passivation layer 520, 530, and contact pad 522 are the same as respective substrate 202, devices 214, interconnect 215, IMD 210, top metal layer 212, passivation layer 220, 230, and contact pad 222, and descriptions of these structures are not repeated.

In the IC 500, the dummy metal structure 551 covers the substrate, except in the areas of: the at least one contact pad 522; and an un-metalized ring 570 having a first un-metalized area around each of the at least one contact pad 522.

Because the dummy metal structure 551 covers the entire area outside of the un-metalized rings 570, there are no connecting metal routing lines formed in the passivation layer 530. Thus, the design of IC 500 may be used when all of the interconnect routing is accomplished within the interconnect structure 515, and no routing is needed in aluminum layer 551. The dummy metal structure 551 has a width W2 that is wider in some at least one location than the width W1 of the contact pad 522.

The dummy metal structure 551 may be formed by a reverse tone process, so that the dummy metal structure 551 covers the substrate, except in the areas of: the at least one contact pad 522, and the un-metalized ring 570 has a first un-metalized area around each contact pad 522.

Depending on the outer diameter of un-metalized rings 570, the metal density of IC 500 may be very high. Thus, it may desirable to include additional un-metalized regions, as shown in FIG. 6.

Figure 6:
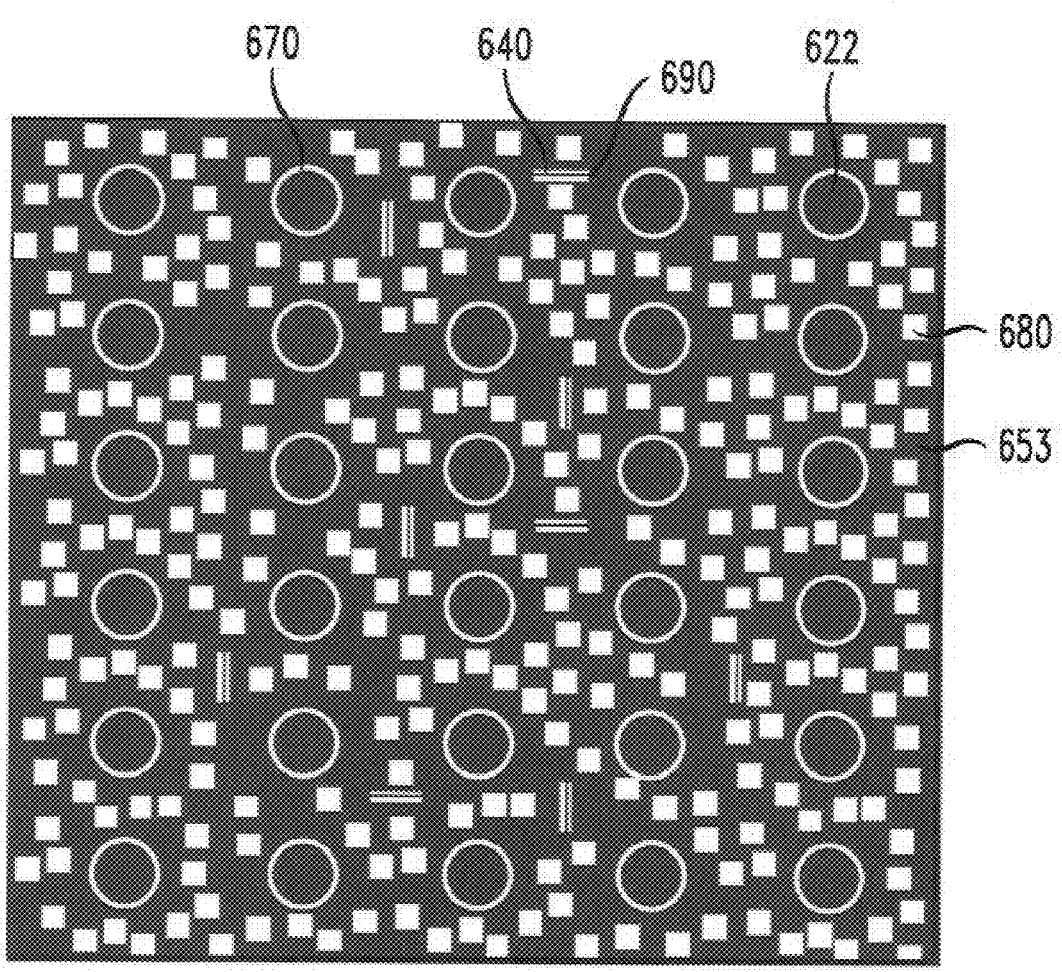
FIG. 6 is a plan view of an IC according to a fifth embodiment.

FIG. 6 is a plan view of a fifth exemplary IC 600, which is a variation of the IC shown in FIGS. 5A and 5B. In FIG. 6, like items have the same reference numerals as in FIG. 5A, increased by 100. The contact pad 622, and rings 670 are the same as respective contact pad 522, and rings 570, respectively, and descriptions of these structures are not repeated. IC 600 differs from IC 200 in two major respects. First, connecting lines 640 (similar to connecting lines 220 of FIG. 2A) are included for additional routing in the aluminum redistribution layer. Second, additional un-metalized regions 680 are provided to reduce the overall metal density to a desired value (e.g., 80%, 70%, 60%, or less). One of ordinary skill in the art will understand that either of these two features may be included without the other. Thus, either the connecting lines 640 or the un-metalized patterns 680 may be added to the IC 500 of FIG. 5.

To incorporate the additional routing patterns 640 into the IC 600, an un-metalized area 690 is formed around each pattern 640, to isolate the conductive lines 640 from each other. The dummy metal structure 653 is formed by a reverse tone process so that the dummy metal structure 653 covers the substrate, except in the areas of: (a) the at least one contact pad 622; (b) an un-metalized ring 670 having a first un-metalized area around each of the at least one contact pads 622; (c) the un-metalized region 690 having a second un-metalized area around each of a plurality of conductive lines 640 that form a routing layer within second sub-layer of the passivation layer; and (d) the one or more discrete un-metalized shapes 680 having a third un-metalized area. The third un-metalized area (total area of shape(s) 680) is sufficiently large so that the passivation layer has a metal density of at least 30% and at most 80%, where the metal density can be calculated as 1.0 minus a ratio of (the first un-metalized area+the second un-metalized area+the third un-metalized area)/substrate area. One of ordinary skill can readily select a size and number of un-metalized shapes 680 that provides any desired metal density.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A structure comprising:
    a semiconductor substrate having semiconductor devices formed thereon or therein;
    an interconnecting metallization structure formed over and connected to the devices, the interconnecting metallization structure including at least one dielectric layer;
    a passivation layer over the interconnecting metallization structure and the dielectric layer; and
    at least one metal contact pad and at least one dummy metal structure in the passivation layer, the contact pad conductively coupled to at least one of the devices, the dummy metal structure being spaced apart from the contact pad and unconnected to the contact pad and the devices.

2. The structure of claim 1, wherein the dielectric layer has a dielectric constant less than 2.6.

3. The structure of claim 1, wherein the passivation layer comprises a first sub-layer over the interconnecting metallization structure, and a second sub-layer over the first sub-layer, the dummy metal structure located in the second sub-layer.

4. The structure of claim 1, wherein:
    the semiconductor substrate has a substrate area, the contact pad has a contact pad area, the dummy metal structure has a dummy metal area and the passivation layer has at least one conductive line with a conductive line area, and
    the passivation layer has a metal density of at least 20%, where the metal density is a ratio of (contact pad area+dummy metal area+conductive line area in the passivation layer)/substrate area.

5. The structure of claim 4, wherein the metal density is at most 80%.

6. The structure of claim 5, wherein the metal density is at least 30%.

7. The structure of claim 1, wherein the dummy metal structure has a width dimension that is greater than a width of the contact pad.

8. The structure of claim 1, wherein the dummy metal structure is connected by way of a dummy via to a dummy pattern in a top metal layer of the interconnecting metallization structure.

9. The structure of claim 1, wherein the dummy metal structure covers the substrate, except in the areas of the at least one contact pad and an un-metalized ring around each of the at least one contact pad.

10. The structure of claim 1, wherein the dummy metal structure covers the substrate, except in the areas of:
   the at least one contact pad,
   an un-metalized ring having a first un-metalized area around each of the at least one contact pad,
   an un-metalized region having a second un-metalized area around each of a plurality of conductive lines forming a routing layer within the passivation layer, and
   at least one discrete un-metalized shape having a third un-metalized area, the third un-metalized area is sufficiently large so that the passivation layer has a metal density of at most 80%, where the metal density is 1.0 minus a ratio of (the first un-metalized area+the second un-metalized area+the third un-metalized area)/substrate area.

11. The structure of claim 1, wherein the dummy metal structure has a thickness T, the at least one dielectric layer has a total thickness t, and a ratio of T/t is at least 0.5.

12. A structure comprising:
   a semiconductor substrate having a substrate area and having semiconductor devices formed thereon or therein;
   an interconnecting metallization structure formed over and connected to the devices, the interconnecting metallization structure including at least one dielectric layer, wherein the dielectric layer has a dielectric constant less than 2.6;
   a passivation layer over the interconnecting metallization structure and the dielectric layer, wherein the passivation layer comprises a first sub-layer over the interconnecting metallization structure, and a second sub-layer over the first sub-layer, the passivation layer having at least one conductive line with a conductive line area; and
   at least one metal contact pad and at least one dummy metal structure in the passivation layer, the contact pad conductively coupled to at least one of the devices, the contact pad having a contact pad area, the dummy metal structure being spaced apart from the contact pad and unconnected to the contact pad and the devices, the dummy metal structure located in the second sub-layer, the dummy metal structure having a dummy metal area,
   wherein the passivation layer has a metal density of at least 20% and at most 80%, where the metal density is a ratio of (contact pad area+dummy metal area+conductive line area in the passivation layer)/substrate area.

13. The structure of claim 12, wherein the contact pad is formed at least partially in the first sub-layer and the dummy metal structure is formed in the second sub-layer.

14. The structure of claim 12, wherein the dummy metal structure has a thickness T, the at least one dielectric layer has a total thickness t, and a ratio of T/t is at least 0.5.

* * * * *